(12) United States Patent
Price

(10) Patent No.: US 6,996,759 B2
(45) Date of Patent: Feb. 7, 2006

(54) DELAY FAULT TEST CIRCUITRY AND RELATED METHOD

(75) Inventor: David P. Price, Eastleigh (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 447 days.

(21) Appl. No.: 10/205,250

(22) Filed: Jul. 25, 2002

(65) Prior Publication Data

US 2003/0101396 A1  May 29, 2003

(30) Foreign Application Priority Data

Aug. 8, 2001 (GB) .................................. 0119300

(51) Int. Cl.
*G01R 31/28* (2006.01)
(52) U.S. Cl. ...................... 714/726; 714/724
(58) Field of Classification Search ................ 714/724, 714/726, 727, 729, 731, 742; 713/500–503
See application file for complete search history.

(56) References Cited

U.S. PATENT DOCUMENTS

| 4,851,909 A | * | 7/1989 | Noske et al. ................ 348/512 |
| 5,987,081 A | * | 11/1999 | Csoppenszky et al. ....... 375/354 |
| 6,065,145 A | | 5/2000 | Bencivenga ................. 714/724 |
| 6,158,030 A | * | 12/2000 | Reichle et al. ............... 714/724 |
| 6,269,041 B1 | * | 7/2001 | Wang et al. ................. 365/222 |
| 2002/0184560 A1 | * | 12/2002 | Wang et al. .................. 714/25 |
| 2003/0097614 A1 | * | 5/2003 | Rajski et al. ................. 714/30 |

* cited by examiner

*Primary Examiner*—Albert Decady
*Assistant Examiner*—John J. Tabone, Jr.
(74) *Attorney, Agent, or Firm*—Michael J. Ure

(57) ABSTRACT

The invention provides for a delay fault testing method and related circuitry for producing a test pulse in response to an input clock signal, and including analysing first and second clock signals having different frequencies and associated with logic circuits having different application speeds, generating a train of two clock pulses for each of the said first and second clock signals, the train of clock pulses being arranged such that the rising edges of the second pulses in each of the said trains are aligned.

11 Claims, 3 Drawing Sheets

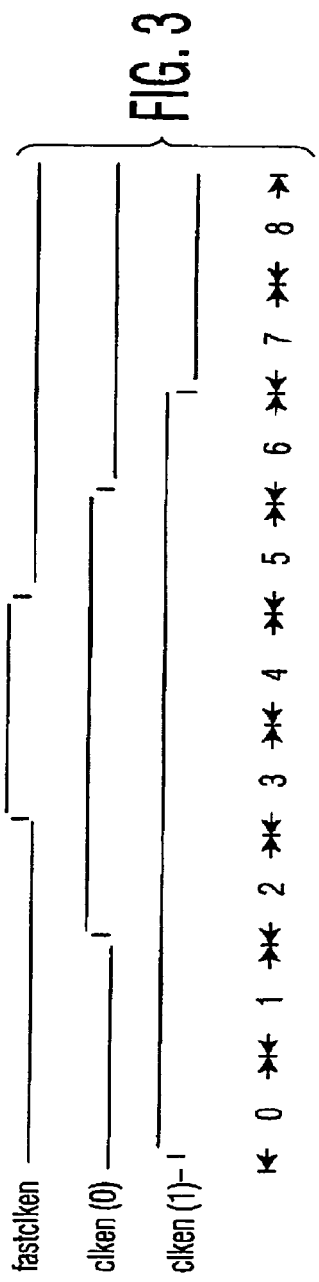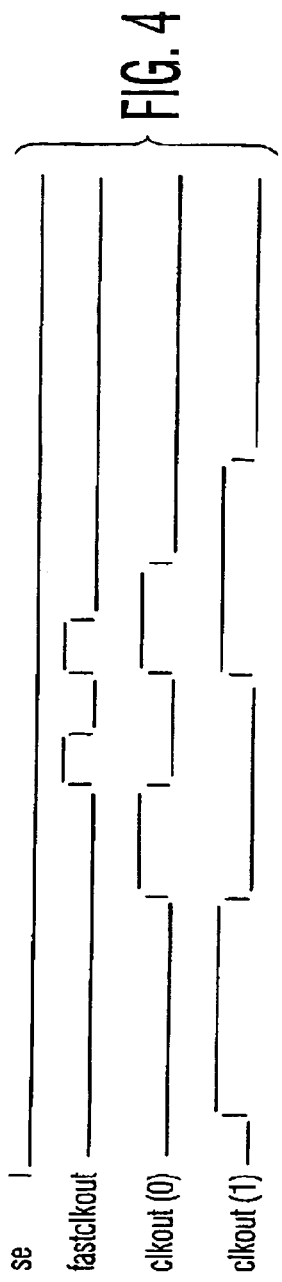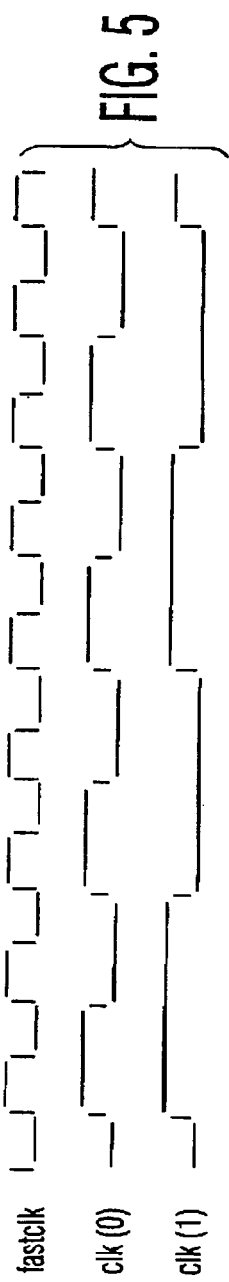

DELAY FAULT TEST CIRCUITRY AND RELATED METHOD

The present invention relates to delay fault test circuitry, and a related method, which circuitry is arranged for producing an output pulse in response to a trigger signal received at the circuitry in order to transfer test data through, for example, a sequential integrated circuit in order to test the integrated circuit for resistive and/or capacitive faults.

Such an arrangement is known from U.S. Pat. No. 6,065,145 which discloses a method for testing path delay faults in sequential logic circuits. While such a method offers advantages over relatively low speed structural stuck-at testing schemes, in that it allows for switching to application frequencies appropriate for the circuitry merely for a short period while the circuit is under test, disadvantages nevertheless exist with respect to the subject matter of U.S. Pat. No. 6,065,145 in that such circuitry is restricted for use with testing data transfers between logic blocks running at a common application speed.

The present invention seeks to provide for delay fault test circuitry, and a related method, which offers advantages over known such circuitry and methods and, in particular, which can allow for the testing of path delay faults exhibited between logic blocks running at different application speeds.

According to a first aspect of the present invention there is provided delay fault test circuitry of the type defined above and characterized in that the circuitry comprises a delay fault pulse generator arranged for analysing first and second clock signals of different frequencies which are associated with logic circuits having different application speeds, and for outputting, in response to the said analysis, a train of two clock pulses for each received clock signal, the delay fault pulse generator being arranged such that the rising edges of each of the second of the said two clock pulses are aligned.

Through such controlled alignment of the rising edges of the said second pulses, circuits such as flip-flops operating in one clock domain can capture data on the second pulse. The transition from a slower clock domain to a faster one will then appear static until the second pulse of the faster clock, whereas the transition from a faster clock domain to a slower one will remain static until the second pulse of the slower clock.

Synchronization of the rising edges of the respective second pulses in this manner allows for the testing of circuitry including logic blocks running at different application speeds. The circuit allows for the measurement of the delay as data travels through digital logic and the aforementioned alignment of the rising edges of the said second pulses allows for a delay in digital logic transmitted from a logic block running in one clock domain to be accurately measured as it is captured in a logic block running in a different clock domain.

In accordance with a second aspect of the present invention, there is provided a method of delay fault testing an integrated circuit for producing an output pulse in response to an input trigger signal, characterized by the steps of analysing first and second clock signals with different frequency which are associated with logic circuits having different application frequencies, generating a train of two clock pulses for each of the said first and second clock signals, the respective train clock pulses being arranged such that the rising edges of the second pulses in each of the said trains are aligned.

The feature of Claim 2 is advantageous in suppressing potential corruption of the initial vector generated by the first application pulse.

The feature of Claim 3 is particularly advantageous in representing a reliable manner for sampling any divided clocks of the fastclk signal.

The features of Claim 4 seek to prevent under flow, or wrap around, in the clock-width back-counter.

Claim 5 proves to be advantageous since it can prove important that the most recent instance from the event counter is stored when all clock signals are rising together before the event counter rolls over.

The subject matter of Claim 8 serves to determine that the width of the output and label signal is wider than the clock that it is arranged to be gating.

The subject matter of Claim 9 proves advantageous in permitting multi-cycle full-scan testing by allowing the clocks to be independently switched-off during their normal cycle.

The invention is described further hereinafter, by way of example only, with reference to, and as illustrated in, the following drawings in which:

FIG. 3 illustrates the enable signals which when gated with the clock signals illustrated in FIG. 5 produce the results as shown in FIG. 4.

FIG. 4 illustrates the associated clock pulses developed in accordance with the present invention and as derived from the clock signals illustrated in FIG. 3; and FIG. 5 illustrates the relationship between the clock signals that can be analysed in accordance with the present invention.

Figure 1:
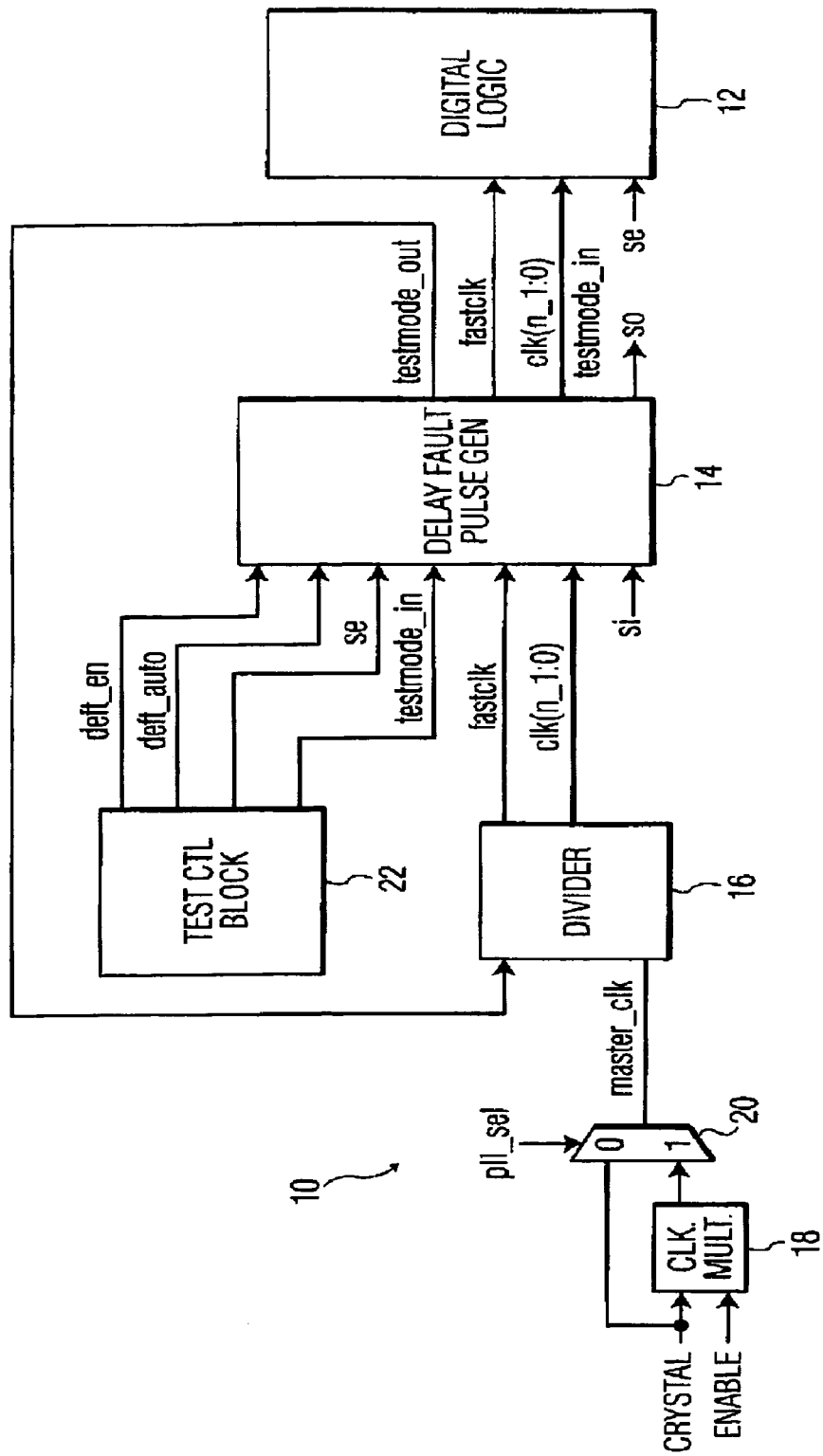
FIG. 1 is a block diagram of a delay fault pulse generator according to an embodiment of the present invention and as integrated into an integrated circuit package.

Turning first to FIG. 1, there is illustrated a schematic block diagram of a delay fault test circuit 10 associated with a digital logic 12 to be driven and wherein a delay fault pulse generator 14 embodying the present invention is located between the output of a clock divider 16 and the digital circuit 12. In the illustrated example, a clock multiplier 18 is provided for receiving a crystal clock signal, the output of the clock multiplier and the crystal clock input being delivered by way of a multiplexer 20 to an input of the clock divider 16. A Test Control Block (TCB) circuit 22 is also provided for delivering flag and enabling signals to the delay fault pulse generator 14.

If a clock multiplier is used to take the crystal clock and multiply its frequency, this must also be controlled in delay fault test mode.

The various signals illustrated in FIG. 1 can be assigned the functional definitions outlined in the table below:

| Signal Name | Type | Comment |
| --- | --- | --- |
| Fastclk | Input | Clock used by clock divider to produce clk(n−1:0) |
| Clk(n−1:0) | Input | n number of divided clocks that will be analysed by this block |
| Se | input | scan enable - flag from TCB that when high indicates that data is being scanned into the flip flops |
| dft_en | input | flag from TCB that when high indicates delay fault test mode is required |

-continued

| Signal Name | Type | Comment |
|---|---|---|
| deft_auto | input | flag from TCB that when high indicates automatic calibrated delay fault test mode is required |
| Testmode_in | input | flag from TCB which bypasses the division of the clock divider block |
| Si | input | scan input - input for clock suppression scan flip flops |
| So | input | scan output - deskewed output from clock suppression scan flip flops |
| fastclkout | output | outputted fastclk - passes unchanged whenever deft_auto is low |
| clk(n−1:0) | output | outputted clk(n−1:0) - passes unchanged whenever deft_auto is low |
| Testmode_out | output | outputted testmode_in which controls clock divider - passes unchanged whenever deft_auto is low |
| calibrated | output | flag to indicate the automatic delay fault test mode status - high when calibration succeeded |

When deft_en goes high, the clock multiplier is enabled since it will require some time to build up to its application frequency. Without this feature, the testing of any delay fault patterns could prove disadvantageously time consuming.

The control of the multiplexer for the multiplied or crystal clock is shown in the table below:

| INPUTS | | | OUTPUTS | | |
|---|---|---|---|---|---|
| Deft_en | test-mode_out | application | pll_sel | enable | Comment |
| 0 | 0 | 0 | 0 | 0 | Application circuit has not switched multiplied clocks on |
|   |   | 1 | 1 | 1 | Application has switched multiplied clocks on |
| 0 | 1 | X | 0 | 0 | Full scan test mode - multiplier bypassed |
| 1 | 0 | X | 1 | 1 | Delay Fault application mode or delay fault pulse generator is calibrating |
|   | 1 | X | 0 | 1 | Delay Fault scan mode - multiplier bypassed |

The following analysis is developed on the basis that there are two further clock signals clk(0), clk(1) in addition to the fastclk signal. In this example, fastclk is the fastest clock, clk(0) is a divide by 2 and clk(1) is a divide by 4 of fastclk as illustrated in FIG. 5.

The clock pulses required during the application cycle will therefore appear as illustrated in FIG. 4. As will be appreciated, the second pulses are all aligned so that data from flip flops within a clock domain will capture data on the second pulse; a slower clock domain or a faster one is static until the second pulse of the fast clock; and a faster clock domain to a slower one will be static until the second pulse of the slow clock.

However, it is noted that corruption of the initial vector generated by the first application pulse can arise and this leads to the requirement to include scan flip flops to permit suppression of either, for both, of the normal cycle pulses on all of the clocks.

To switch these pulses, clock enable signals are required and the negative edges of the fastest clock, here fastclk is used in order to avoid the gated clocks glitching.

In order to establish when to switch the enable signals, the event counter such as that illustrated with reference to FIG. 3 can be employed.

From the event counter states illustrated in FIG. 3 it can be seen that the positive edge of fastclken must be activated in event state 3, clken(0) must be activated in event state 2, and clken(1) must be activated in event state 0. This can be calculated by means of a width counter since it is recognised that fastclk is 1 cycle wide, clk(0) is 2 cycles wide, and clk(1) is 4 cycles wide.

A point at which all the clocks have risen to be high must first be found. This is termed clocksync and in the example illustrated in FIG. 3 such a point is found in event 4. This point must be at least halfway through the event counter. Next, by means of a reverse count conducted backwards from clocksync, it can be determined that fastclken=4−1=>3, clken(0)=4−2=>2, and clken(1)=4−4=>0 as is required from the above.

Figure 2:
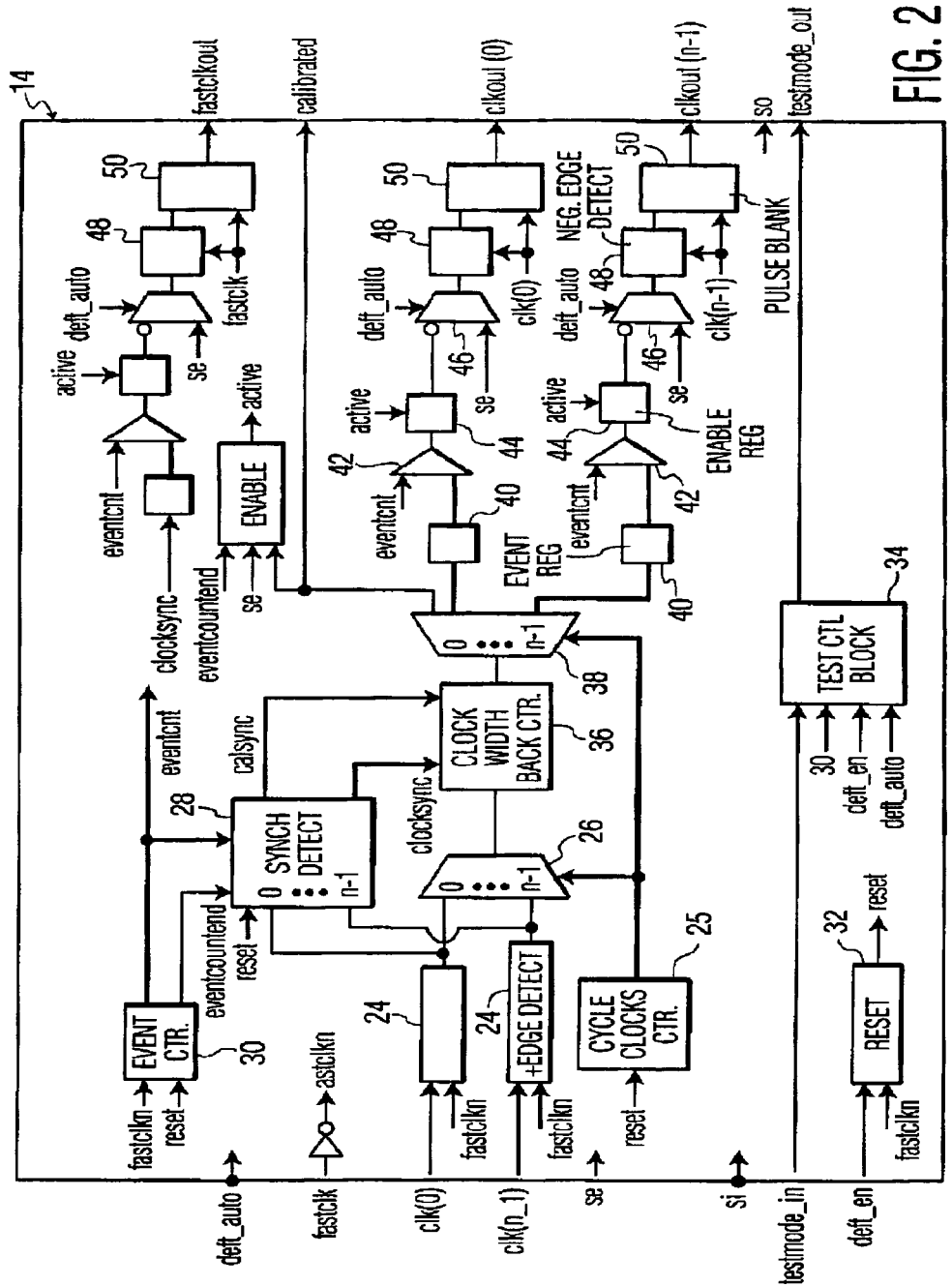
FIG. 2 is a detailed schematic block diagram illustrating the delay fault pulse generator of FIG. 1.

Referring now to FIG. 2, there is provided an indication of how the positive edge is derived. The negative edge of the enable is generated by a negative-edge triggered circuits triggered by their own respective clocks.

As noted, FIG. 2 represents a functional block diagram of the delay fault path generator 14 of FIG. 1. The input and output signals illustrated in FIG. 1 are also shown in FIG. 2 from which it will be seen that clock signals clk(0)–clk(n−1) are delivered to positive edge detectors 24 each of which offers an output delivered to both a clock signal multiplexer 26 and also a synchronization detector 28. The synchronization detector 28 also receives an input from an event counter 30. A further positive edge detector in the form of a reset circuit 32 is provided for generating a reset signal and a testmode input signal delivered to the pulse generator 14 exits the generator as a testmode output signal by way of a test control block 34. The edge-detected clock signal multiplexer 26 and synchronization detector 28 deliver outputs to a clock-width back-counter 36 which, in turn, delivers an output to a clock event signal demultiplexer 38. The clock event signal demultiplexer 38 is arranged to deliver respective output clock event signals by way of series connected event registers 40, event comparators 42, enable registers 44, enable multiplexers 46, negative edge detectors 48 and pulse blankers 50. The operation of the pulse generator 14 embodying the present invention as illustrated in the schematic block diagram of FIG. 2 and is described further below.

As mentioned, the delay fault pulse generator 14 is inserted between the output of the clock divider block 16 and the logic circuit 12 to be fed as shown in FIG. 1. The entire circuit is operated on the inverted fastclk as this proves to be the most appropriate and reliable time to sample any clocks divided from fastclk. When the delay fault mode is not enabled, most of the circuit can advantageously be shut down to reduce application mode current.

The test control 34 is used to control the testmode signal, which serves as a flag that is set high during digital test so as to remove the division on all application clocks. This then allows the scan-based test to transmit and receive data across different clock domain boundaries.

The following table shows how the testmode_out is controlled.

| deft_en | Deft_auto | se | testmode_out | calibrated | Comments |
|---|---|---|---|---|---|
| 0 | 0 | 0 | 0<br>testmode_in =<br>0 | X | Application Mode<br>Most of DEFT shut down<br>Clocks passed through |
| 0 | 0 | 1 | 1<br>testmode_in =<br>1 | X | Scan mode<br>Most of DEFT shut down<br>Clocks passed through |
|   |   | 0 | 1<br>testmode-<br>in = 1 | X | Single-cycle digital normal<br>mode<br>Pulses output |
| 0 | 1 | 1 | 1<br>testmode_in =<br>1 | X | Scan mode<br>Most of DEFT shut down<br>Clocks passed through |
| 0 | 1 | 0 | 1<br>testmode<br>in = 1 | X | Multi-cycle digital normal<br>mode<br>suppressable pulses output |
| 1 | 0 | 1 | 1 | X | Scan mode<br>Clocks passed through |
|   |   | 0 | 0 | X | DEFT -dumb- application mode<br>Two unsynced pulses output |
| 1 | 1 | 1 | 0 | 0 | DEFT Calibration mode<br>Calibration in progress<br>Clocks passed through |
|   |   | 1 | 1 | 1 | Scan mode<br>Calibration completed<br>Clocks passed through |
|   |   | 0 | 0 | 1 | DEFT -auto- application mode<br>Two Suppressible synced pulses output |

Referring to the above table, it should be appreciated that a 0 to 1 transition must be seen on deft_en to initiate a reset and so start the completed. If the calibration fails, i.e. if se is set low before calibration has completed, or no sync point can be found, no pulses will be generated. As mentioned this "dumb" mode has been added as a backup in case calibration fails for some reason. Each clock output will produce two clocks but will not have the second pulse aligned. The first pulse may or may not be aligned depending on where the signal is asserted in the clock dividers cycle.

It should also be noted that, as the clocks are being gated, much care has to be taken to switch the clocks on and off at instances that are skew-tolerant and will not narrow the output pulses.

The event counter 30 is switched on and left running all the time that the deft_en signal is high. This is advantageously used as a time reference for determining the occurrence of clock transitions. The signal evencountend indicates when the event counter 30 rolls over back to zero again. The length of the event counter 30 is preferably arranged to be three times the length of the repetition rate of the clocks. This repetition rate comprises the number of fastclks that occur between the times at which all of the clocks have their rising edges coincient. This is to guarantee that the clock-width back-counter 36 does not under-flow i.e. wrap around.

The Reset Circuit 32 detects a low to high transition i.e. a positive edge, on deft_en and generates a reset, which sets the cycle clocks counter 25 the sync detector 28 and the enable registers 40.

The positive edge detectors 24 on clk(0)–clk(n−1) detect low to high transitions on each of these clocks as divided from the fastclk.

The sync detector 28 simultaneously checks all of the positive edge detector 24 to determine when all of the clocks are rising together. The time reference from the event counter 30 is read off and stored as clocksync and the calsync flag are set high. Since the clock-width back-counter 36 will be back-tracking from clocksync, it can prove advantageous that the last instance is stored when all clocks are rising together before event counter 30 rolls over at the evencountend signal. If the sync detector 28 fails to find a point when all the clocks rise together, calsync will remain low and this will prevent the calibrated signal being set, and also prevent the delivery of any output pulses in the application cycle.

The arrangement comprising the cycle clocks counter 25 the edge-detected clock multiplexer 26 and the clock event demultiplexer 30 is an implementation issue for optimising the number of gates used in the design. Without it, a separate clock-width back-counter 36 would be required for every clock signal to be analysed. In the illustrated embodiment of course, in addition to a small counter serving to cycle the clocks. Thus, in the invention, each clock can be analysed separately and after the analysis of the last clock clk(n−1) has been completed, the calibrated flag is set to indicate that calibration has been completed.

The clock-width back-counter 36 is initiated when the calsync signal goes high and so can take clocksync as a starting point for counting down by the width of the clock. This is the point that the enable on this clock must then be switched on in order to allow the second pulses to be aligned.

The event registers 40 are arranged to store each value calculated by the clock-width back-counter 36.

An enable block is used to activate the enable registers 44 during the application cycle i.e. when the tester pulls the se signal low. It only activates the active signal when the calibrated signal indicates that calibration has been completed, and when an evencountend signal has occurred after the se signal has gone low. Waiting for the counter to roll over advantageously ensures that the pulses are not generated in the middle of the event counter cycle which would give rise to unpredictable results. The event comparators 42 are arranged to compare the current time reference against the required time in the event registers 40 and to activate the enable registers 44 accordingly.

The enable multiplexer 46 is used to switch between the automatic delay fault mode such as described above and a "dumb" mode. The "Dumb" mode is included to serve as a backup only if the automatic delay fault mode fails. It will however generate two pulses on each of the clocks regardless of whether calibration has passed or failed. However, it should be appreciated that these clocks will not have their second pulses aligned and so the "dumb" mode cannot be used to test cross boundary data transfer. It should also be noted that on the se signal a synchronized flip flop is effectively provided driven by its own inverted respective clock.

The negative edge detector 48 generates an output which is derived from the falling edge of its input and which is high for two clock periods. It should be noted that it operates on the negative edge of its own respective clock, and not on the fastclkn. This guarantees that the width of the output enable signal is wider than the clock that it will be gating.

Clock blanking and gating is provided by the pulse blanker 50 which serves to generate the two clock pulses by ADDING the respective clock with the enable signal derived from the negative edge detector. These two pulses can be independently blanked or suppressed, by scanning a zero into the respective flip flop in this block. By creating a simplified model of the delay fault pulse generator block, a scan pattern generation tool can automatically analyse and generate patterns that can make use of this feature for data transfers between clock boundaries. Also, the clock blanking and gating permits multi-cycle fullscan testing by allowing the clocks to be independently switched off during their normal cycle.

The automatic mode of operation is arranged to follow the following sequence:

1) Reset:
   When a low to high transition on deft_en is detected the block is reset and calibration starts;
2) Calibration run:
   testmode_out is forced low so that the clock dividers supplying this block provide their maximum application clocks and sync detector 28 locates and stores the event of all the clocks rising together. The clock-width back-counter 36 locates and stores the event when each clock needs to be activated and the calibrated flag set high. The maximum calibration time will be:
   (2+n/3)×length of event counter×fastclk period.
3) After calibration
   testmode_out now follows se.
   Every time se falls low the circuit waits until the Event Counter 30 rolls over and then initiates the two pulses at the correct points to synchronise the second pulses. The maximum time before the pulses will be seen is:
   2×length of Event Counter×fastclk period.

Since, the illustrated embodiment of the invention has been designed to work on the negative edge of the fastclk signal, automatic calibration becomes unreliable if used on any divided clock that changes on the negative edge of fastclk. By delaying only the fastclk supplied to this block, for example by using asynchronous gates, this restriction is removed. However the invention does then become technology dependent.

It should be appreciated that the illustrated embodiment has been designed in VHSIC Description Language and is advantageously small by virtue of the multiplexing of the clocks, the effective re-use of the negative edge detector and by minimisation of the counter sizes.

It can also achieve fast operation speeds although this can prove to be dependent on the synthesis of the circuit. However, the calibration can be achieved with a reduced fastclk, since only the relative division ratio is relevant and the circuit can then be run at a much higher speed once calibrated. In this mode, the main potential speed restriction will be dependent upon the structure of the event counter.

As a further advantage, the invention is readily configurable using VHDL's generic capability, and so does not require alteration when instantiated. When the number of clocks and the maximum repetition rate multiplied by three is specified, during synthesis a block can be is generated to meet any particular requirement.

As already noted, it is reliable when not in delay fault mode as clocks are passed straight through experiencing only the delay of one gate. If in delay fault mode, the aforementioned "dumb" mode will always generate two pulses regardless of the calibration status and the se and testmode signals are protected by negative-edge triggered flip flops.

Further, the arrangement can advantageously be simulated correctly without producing glitches, or unknowns, and has a low power requirement since during application most of the delay fault pulse generator can be shut down.

What is claimed is:

1. Delay fault test circuitry for producing an output pulse in response to an input trigger signal, wherein the circuitry comprises
   a delay fault pulse generator arranged for analysing first and second clock signals of different frequency which are associated with logic circuits arranged to run at different speeds, and for, in response to such analysis, outputting for the first clock signal a train of two clock pulses, including a first clock pulse and second clock pulse, and outputting for the second clock signal a train of two clock pulses, including a first clock pulse and second clock pulse, the delay fault pulse generator being arranged such that a rising edge of the second clock pulse for the first clock signal is aligned with a rising edge of the second clock pulse for the second clock signal.

2. Circuitry as claimed in claim 1 and including scan flip flops arranged to suppress at least one of the normal cycle pulses on said first and second clock signals.

3. Circuitry as claimed in claim 1, and arranged for operation on an inverted version of a fastest one of said first and second clock signals.

4. Circuitry as claimed in claim 1 and including an event counter arranged for determining the occurrence of clock transitions and arranged to operate at, at least three times a repetition rate of a fastest one of said first and second clock signals.

5. Circuitry as claimed in claim 4, wherein a time reference from the said event counter is stored.

6. Circuitry as claimed in claim 5, and including means for generating clock enable signals serving to switch the clock pulses on the negative edges of the fastest one of said first and second clock signals.

7. Circuitry as claimed in claims 1, and arranged with means for switching between a delay fault mode and a backup mode in which a train of two clock pulses, including a first clock pulse and second clock pulse, are generated for the first clock signal and a train of two clock pulses, including a first clock pulse and second clock pulse, are generated for the second clock signal, without deliberately aligning the rising edge of the second clock pulse for the first clock signal with the rising edge of the second clock pulse for the second clock signal.

8. Circuitry as claimed in claims 1, and including negative edge detector means arranged to operate on a negative edge of at least one of the first clock signal and the second clock signal so as to generate an output signal which is logic high for two clock periods.

9. Circuitry as claimed in claim 8, and including clock blanking and gating means for generating said train of two clock pulses for said at least one of the first clock signal and the second clock signal through a logical combination of said least one of the first clock signal and the second clock signal with an enable signal derived from said negative edge detector.

10. Circuitry as claimed in claims 1, and including clock-width back-counter means for receiving clock signals derived from said first and second clock signals one at a time from a multiplexer and for delivering an output to a demultiplexer.

11. A method of delay fault testing an integrated circuit and including the step of producing an output test pulse in response to an input trigger signal, comprising the steps of
analysing first and second clock signals having different frequencies and associated with logic circuits having different application speeds, generating a train of two clock pulses, including a first clock pulse and second clock pulse, for the first clock signal and generating a train of two clock pulses, including a first clock pulse and second clock pulse, for the second clock signal, such that a rising edge of the second clock pulse for the first clock signal is aligned with a a rising edge of the second clock pulse for the second clock signal.

* * * * *